United States Patent [19]

Clewes et al.

[11] 3,820,054

[45] June 25, 1974

[54] ELECTRICAL SOCKETS

[75] Inventors: Antony Brasher Clewes, Sherwood; Denis William Tuckwood, Beeston, both of England

[73] Assignee: TRW Inc., Cleveland, Ohio

[22] Filed: Nov. 2, 1972

[21] Appl. No.: 308,245

[30] Foreign Application Priority Data

Nov. 19, 1971 Great Britain .................... 53843/71

[52] U.S. Cl. ........ 339/17 CF, 339/61 M, 339/75 M, 339/174

[51] Int. Cl. .......................... H05k 1/04, H01r 13/62

[58] Field of Search ........... 339/17 L, 17 LM, 17 C, 339/17 CF, 74, 75 M, 75 MP, 59, 61, 174, 176 MP, 193 VS, 210

[56] References Cited

UNITED STATES PATENTS

| | | | |
|---|---|---|---|
| 3,391,383 | 7/1968 | Antes | 339/174 |
| 3,409,861 | 11/1968 | Barnes et al. | 339/174 |
| 3,622,950 | 11/1971 | Millinger | 339/174 |
| 3,639,888 | 2/1972 | Pittman et al. | 339/75 MP |
| 3,683,317 | 8/1972 | Walkup | 339/174 X |

OTHER PUBLICATIONS

Evans, "Wedge-Activated Low-Insertion Force Connector," IBM Tech. Disc. Bulletin, Vol. 11, No. 11, page 1443, April 1969.

*Primary Examiner*—Bobby R. Gay
*Assistant Examiner*—Lawrence J. Staab
*Attorney, Agent, or Firm*—Lawrence S. Cohen; Joseph E. Kieninger

[57] ABSTRACT

An electrical connection socket for securing to a printed circuit board and enabling connection of a DILIC package with electric circuits of that board includes on a base member socket contact members arranged to receive adjacent them plug contact members of the DILIC package, side members hinged on the base member and movable from baised non-operative positions to operative positions in which they press together associated socket and plug contact members to provide good electrical contact therebetween, and end members hinged on the base member and biased to locking positions in which they retain the side members in their operative positions when closed to those positions.

The base member, the side members and the end members are moulded integrally with one another from an electrically-insulating plastics material.

25 Claims, 4 Drawing Figures

PATENTED JUN 25 1974 3,820,054

ELECTRICAL SOCKETS

This invention relates to an electrical connection socket for enabling the ready connection, and disconnection, of an electrical circuit package (for example of the integrated circuit kind) with, and from, associated electrical circuity which is disposed for example on a printed circuit board or other electrical circuit module.

Electrical circuit packages are commonly provided with external contact members, which in the case of small packages (for example integrated circuit packages) are necessarily of relatively delicate proportions, and which when being subjected to substantial axial thrusts, as when being inserted into socket contacts, are susceptible to distortion or other forms of damage.

In existing forms of socket for receiving the contact members of integrated circuit packages the socket contacts are generally arranged to exert high transverse compressive forces on the respective package contact members in order to ensure good reliable electrical contact between the socket contacts and the associated package contact members when in the operative position. As a consequence of this each package contact member has to exert a considerable axial thrust on the associated socket contact whereby to expand or deflect it so as to gain access to the operative position.

Since an integrated circuit package has normally many contact members which are to be inserted simultaneously into their respective socket contacts, the package has to be subjected to a relatively high insertion force when plugging in to the associated socket. Such a force applied to the small package, often in a restricted space, may easily result in high accidental side thrusts so that the package and its contact members may become damaged.

The risk of such damage being sustained may be reduced by decreasing the transverse compressive forces to be exerted on the package contact members by the socket contacts, but this is done only at the risk of producing poorer electrical circuit reliability in the socket.

According to one feature of the present invention in such a socket the socket contacts are arranged to exert by themselves substantially no (preferably none) transverse compressive forces on the package contact members, so that substantially no resistance to axial movement is offered during the insertion and withdrawal of the package contact members; and movable contact pressure inducing means, movable between non-operative and operative positions, are provided for inducing transverse contact pressures between the socket contacts and their associated package contact members when they lie in interengaging positions.

According to another feature of the present invention releasable locking means are provided for retaining the contact pressure inducing means in the operative position whereby to render the plugged-in electrical circuit package electrically operative.

The locking means is preferably biased to a locking position, and is temporarily displaceable from the locking position by the pressure inducing means on movement thereof to the operative position.

Manual displacement of the locking member from the biased position enables the pressure inducing means to move to the non-operative position, and the subsequent easy withdrawal of the electrical circuit package from the socket.

When the package contact members are disposed in-line in a row the pressure inducing means may comprise a pressure inducing bar member arranged for movement relative to a socket body in which the socket contacts are disposed, and to co-operate with each socket contact and its associated package contact member whereby when in the operative position to simultaneously induce pressures between all of the socket contacts and their associated package contact members; and the releasable locking means comprises a locking member arranged for movement relative to the body and to co-operate with the pressure inducing bar member.

The pressure inducing bar member is preferably pivotally mounted on the socket body for angular movement between the non-operative and operative positions; and likewise the locking member is preferably pivotally mounted on the socket body for angular movement between locking and unlocking positions.

The socket body and the pressure inducing and locking members may comprise mouldings of a plastics material, and preferably these parts are of integral construction, being formed together in a single moulding process. In this latter case the pressure inducing and locking members may be joined to the socket body by hinged parts of appropriate cross section. In such a single piece moulding the pressure inducing bar member is biased to the non-operative position, and the locking member is biased to the locking position. Thus locking occurs automatically on movement of the bar member to the operative position, and the bar member is released by displacement of the locking member from its biased position.

Some integrated circuit packages known as "dual in-line integrated circuit packages," or more simply as DILIC packages) have two parallel rows of contact members disposed in-line along the respective opposite sides of the package. A socket member according to the present invention for such a DILIC package has for each row of package contact members a pressure inducing bar member and an associated locking member. Preferably, the pressure inducing bar members are arranged for movement towards one another to their respective operative positions, so that pinching these members together as by a pair of tongs, or a finger and thumb, will be all that is necessary to electrically engage the DILIC package in the socket once its contact members have been inserted in to the socket.

In this arrangement the locking members associated with the respective pressure inducing bar-members may be combined into a single locking member, and advantageously one such combined locking member is provided at each end of the pressure inducing members for engaging with their respective end portions of both bar members.

In a DILIC package socket the respective rows of socket contacts may be arranged for engagement with the inwardly-facing contact surfaces of the two rows of package contact members, and the pressure inducing bar members may be arranged in such a case to exert inwardly-directed forces on the two rows of package contact members whereby to compress them against the corresponding rows of socket contacts. Furthermore, in this socket the socket contacts are preferably secured firmly against the socket body near the contact entry openings so that the insertion of a row of package contact members on the wrong side of a row of socket contacts is prevented.

One electrical socket according to the present invention suitable for a dual in-line integrated circuit package will now be described by way of example and with reference to the accompanying drawings in which.

Figure 1:
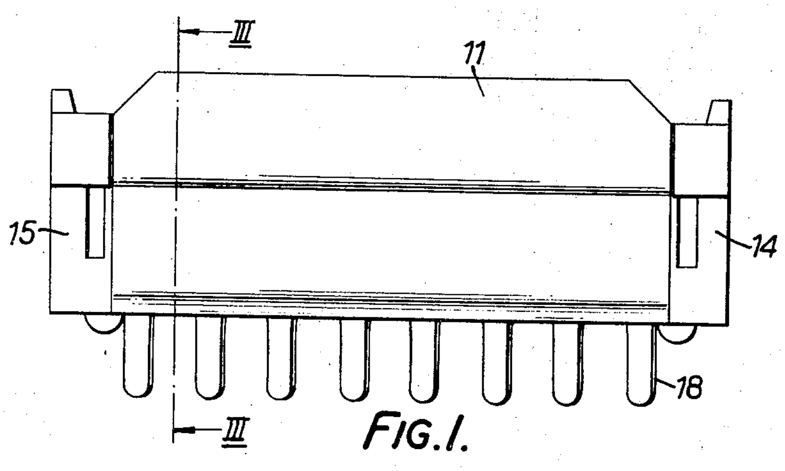
FIGS. 1 and 2 show respectively an elevation and a plan view of the socket in the operative condition.
Figure 2:
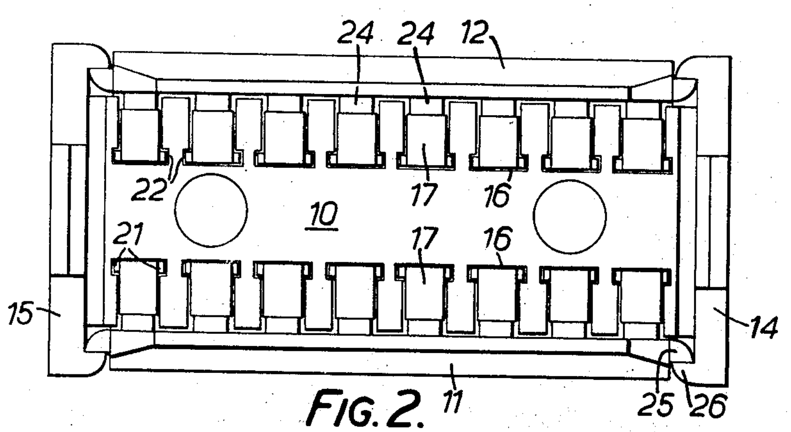
Figure 3:
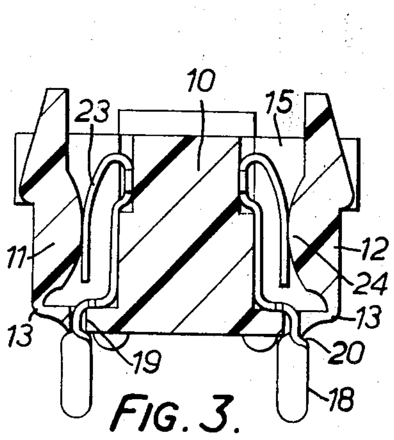
FIG. 3 shows a section of the socket taken on the line III—III of FIG. 1.

Referring now to the drawing the socket includes a single-piece moulding of a resilient plastics material of the thermo-setting kind (for example nylon). The moulding comprises a central body portion 10 having two 'hinged' contact pressure inducing side members 11 and 12 secured along the lower side parts of the body portion by hinge portions 13 of reduced cross-section, and two upstanding locking members 14, 15 secured on the lower end parts of the body member.

The central body portion has formed therein two rows of spaced contact slots 16 arranged back to back, and in each slot is secured a socket contact 17 of a resilient metal such as phosphor-bronze. Each contact is shaped as shown; has its lower end 18 projecting through a hole 19 in the base of the contact slot and is retained therein by a twist 20 formed in the contact immediately below the body portion; has its upper parts firmly held against the back of the contact slot by transverse wings 21 which project side-ways into recesses 22 which lead off on either side of the contact slot; and has a downwardly pointing resilient contact knuckle 23 for making electrical contact with a package contact member when inserted in the contact slot.

Each hinged side member 11, 12 is provided with a series of integrally formed pressure pads 24 which are aligned with the respective contact slots in the body portion. These pressure pads are arranged to project, when the side members are in their vertical operative positions, into the corresponding contact slots, and there abut the contact knuckles without deflecting them substantially.

The side members are retained in their vertical operative positions by the inter-engagement of catch parts 25 formed thereon with other catch parts 26 formed at the extremities of the two locking members 14, 15.

Manual deflection of these two locking members in outward directions against their natural resilience enables the catch parts 26 thereon to move clear of the engaging catch parts 25 on the ends of the side members, so that the side members are then free under the natural resilience of their respective hinge parts 13 to open or hinge outwardly and thereby withdraw their pressure pads well clear of the contact slots.

Figure 4:
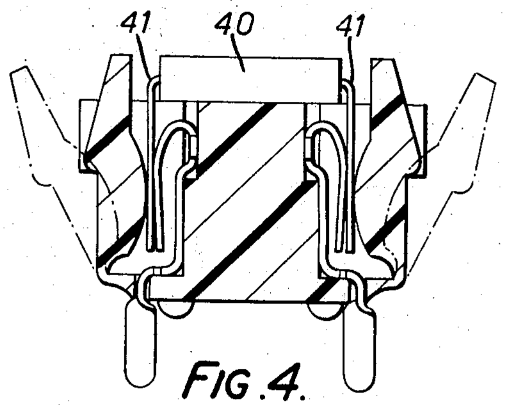
FIG. 4 shows a section similar to that of FIG. 3, but with a DILIC package shown in position in the socket, the pressure inducing bar members being shown in full lines in the operative condition, and in chain-dotted lines in the in-operative condition.

The locking members regain their upright positions after release so that they are again ready to engage the side members when they are next closed into their vertical positions. The side members normally remain in the chain-dotted positions shown in the FIG. 4 when not closed on to a DILIC package.

To connect a DILIC package 40 in the socket the package contact members 41 (see FIG. 4) are inserted in the two rows of contact slots 16 with the two rows of package contact members straddling the central body portion 10 and the respective socket contacts 17.

When fully inserted the two rows of socket contacts may have only very light contact with, or even slight clearance from, the corresponding rows of package contact members so that no proper electrical circuit connection is yet established between the package and the socket.

The two side members are now pinched together by hand, or by tongs, so that their respective pressure pads press hard on the respective package contact members and press these firmly against the resilient socket contact knuckles.

In moving to their respective vertical positions the side members deflect the locking members outwardly, and as the side members reach their vertical positions the catch parts of the side members move clear of the catch parts of the locking members, so that the latter then spring inwardly again to engage behind the catch parts of the side members and so prevent the side members hinging outwardly again when they are released from the grip of the tongs or hand.

The package contact members are thus held firmly and positively in good electrical contact with the respective socket contacts.

To withdraw the package from the socket the two locking members are prised outwardly so as to release the catch parts of the side members from engagement with those of the locking members, whereupon under their natural resilience the side members open outwardly and relieve the pressure of the package contact members on the socket contacts. The package is then free to be withdrawn without resistance to motion.

Whereas in the above described embodiment the side members are formed integrally with the body portions, they may alternatively be made separately and be provided with hinges for joining them to the body portion and appropriate bias spring means.

The anchoring of the upper parts of the socket contacts in the contact slots by the transverse wings prevents the inadvertent (and possibly damaging) insertion of a row of package contact members between a row of socket contacts and the adjacent body portion.

The socket contact tangs 18 may be readily inserted into holes drilled in a printed circuit board, and be flow-soldered to printed circuit connections carried on the reverse side of the board.

Whereas in the above described embodiment the package contact members have straddled the socket contacts and have been contacted by the pressure pads of the pressure inducing side members, in alternative forms of socket the rows of package contact members may nest between the rows of socket contacts, and the pressure pads may contact the socket contacts instead, whereby to press them into contact with the package contact members.

The side members and/or the locking members may be provided at their upper free edges with cusps for engaging with the DILIC package when operatively in position in the socket, so that the package is mechanically prevented, by the cusps, from working loose during operation. These cusps are inherently withdrawn from engagement with the package when the locking members and side members move outwardly from the package to enable it to be withdrawn.

In summary the sockets described above have the following features:

*a.* they require little or no insertion force;

*b.* they can have high contact pressures since these are not limited by considerations of avoiding distortion during insertion;

*c.* they have on account of the high contact pressures low susceptibility to contact corrosion troubles;

*d.* they occupy low volumes, so that high packing densities can be attained; and

*e.* they avoid the possibility of damage from attempts to insert package contact members on the wrong side of the socket contacts.

In a modified form of the socket described above the socket contact tangs 18 are of small square cross-section suitable for receiving "wrapped-wire" connections.

The principles of operation of the above-described electrical connection socket may be applied in other forms of electrical connection sockets. For example, a socket for connection with but a single row of plug contact members comprises essentially half the socket described, one half thereof disposed on one side of a longitudinal centre line being omitted.

Other forms of contact pressure-inducing means may be used. For example, a pressure-inducing means may be moved between its non-operative and operative positions by suitable sliding cam devices.

Furthermore, the socket contact members may be disposed in other formations so as to suit other plug contact member formations.

We claim:

1. An electrical connection socket for cooperation with plug contact members of a cooperating electrical device whereby to provide electrical connection with electric circuits of that device comprising;

an electrically-insulating base member carrying a plurality of socket contact members spaced apart in two spaced parallel rows to receive adjacent them the respective plug contact members of the said device, a contact pressure inducing bar disposed on the base member along the outer side of each row of socket contact members and movable relative thereto from an outward non-operative position to an inward operative position extending parallel to and adjacent the rows of socket contact members in which the pressure inducing means simultaneously presses together mating parts of the respective associated plug and socket contact members whereby to provide satisfactory electrical contact pressure therebetween, the pressure inducing means being ineffective when in the non-operative position to press the said mating parts together to any substantial extent and has a catch part thereon; and at least one releasable locking member carried by the base member and movable relative thereto in a direction normal to that of the pressure inducing bars from a release position to a locking position in which it retains the pressure inducing bars in their operative position by means of catch parts arranged to engage the cooperating catch part on the pressure inducing bar when the bar is in its operative position and thereby restrain the bar against reverse movement.

2. An electrical connection socket according to claim 1, wherein the pressure inducing bar member is hinged along a longitudinal side part of the base member, and the locking member is hinged along a transverse side part of the base member.

3. An electrical connection socket according to claim 2, wherein the pressure inducing bar member is biased to its nonoperative position, and the locking member is biased to its locking position.

4. An electrical connection socket according to claim 2, wherein the base member, the pressure inducing bar member and the locking member are all of an electrically-insulating plastics material, and are moulded integrally with one another.

5. An electrical connection socket according to claim 4, wherein the pressure inducing bar member is biased to its non-operative position, and the locking member is biased to its locking position.

6. An electrical assembly comprising an electrical connection socket according to claim 5 having its socket contact members in electrical contact with plug contact members of an electrical device.

7. An electrical connection socket according to claim 5, wherein each socket contact member is of flat strip-form, lies adjacent a supporting wall of the base member, and has a contact making surface remote from the supporting wall, and wherein the pressure inducing means is arranged on movement to its operative position to press each plug contact member, when in position adjacent its cooperating socket contact member, against the said mating surface of the cooperating socket contact member.

8. An electrical connection socket according to claim 7, wherein each socket contact member has a resilient free end portion which is doubled back relative to a part thereof lying adjacent the supporting wall, and which provides the said contact making surface remote from the supporting wall.

9. An electrical connection socket according to claim 8, wherein each said supporting wall comprises an end wall of a socket contact member locating slot formed in the base member, and wherein each socket contact member is secured in its locating slot by wings formed on the sides of the contact member which project sideways into transverse recesses formed in the respective side walls of the slot.

10. An electrical connection socket for cooperation with plug contact members of a cooperating electrical device whereby to provide electrical connection with electric circuits of that device comprising;

an electrically-insulating base member carrying a plurality of socket contact members spaced apart in two spaced parallel rows to receive adjacent them the respective plug contact members of the said device, contact pressure inducing bars carried on the base member and disposed along outer sides of the two rows of socket contact members and movable relative thereto from an outward non-operative position to an inward operative position parallel to and adjacent the respective rows of socket contact members whereby the pressure inducing bars simultaneosuly press together mating parts of the respective associated plug and socket contact members in the respective rows to provide satisfactory electrical contact pressure therebetween, the pressure inducing bars being ineffective when in the nonoperative position to press the said mating parts together to any substantial extent; and at least one releasable locking member hinged on the base member for pivotal movement normal to the direction of movement of the pressure inducing bars from a release position to a locking position retaining the pressure inducing bars in their operative position, and having catch parts arranged to engage corresponding catch parts on the pressure inducing bars when the bars are in their operative positions and thereby restrain the bars against reverse movement, and on movement to the release position to release the bars for return to their non-operative positions.

11. An electrical connection socket according to claim 10, wherein the pressure inducing bar members are hinged on the base member for movement towards their respective associated rows of socket contact members and have catch parts thereon, and the locking means comprises at least one locking member hinged on the base member for pivotal movement normal to the direction of pivotal movement of the respective pressure inducing bar members, and having catch parts arranged to engage the corresponding catch parts on the respective pressure inducing bar members when those bar members are in their respective operative positions and thereby restrain those bar members against reverse movement.

12. An electrical connection socket according to claim 11, wherein the pressure inducing bar members are hinged along opposite longitudinal side parts respectively of the base member, and the locking member is hinged along a transverse side part of the base member.

13. An electrical connection socket according to claim 12, wherein the pressure inducing bar members are biased towards their respective non-operative positions, and the locking member is biased towards its locking position.

14. An electrical connection socket according to claim 12, wherein the base member, the pressure inducing bar members and the locking member are all of an electrically-insulating plastics material, and are moulded integrally with one another.

15. An electrical connection socket according to claim 14, wherein the pressure inducing bar members are biased towards their respective non-operative positions, and the locking member is biased towards its locking position.

16. An electrical connection socket according to claim 11, wherein the locking means includes a further and similar locking member, the respective locking members being disposed adjacent and cooperating with opposite ends of the two pressure inducing bar members.

17. An electrical connection socket according to claim 16, wherein the pressure inducing bar members are hinged along opposite longitudinal side parts respectively of the base member, and the locking members are hinged along opposite transverse side parts respectively of the base member.

18. An electrical connection socket according to claim 17, wherein the pressure inducing members are biased towards their respective non-operative positions, and the locking members are biased towards their respective locking positions.

19. An electrical connection socket according to claim 17, wherein the base member, the pressure inducing bar members, and the locking members are all of an electrically-insulating plastics material, and are moulded integrally with one another.

20. An electrical connection socket according to claim 19, wherein the pressure inducing bar members are biased towards their respective non-operative positions, and the locking members are biased towards their respective locking positions.

21. An electrical connection socket according to claim 20, wherein each socket contact member is of flat strip-form, lies adjacent a supporting wall of the base member, and has a contact making surface remote from the supporting wall, and wherein the pressure inducing means is arranged on movement to its operative position to press each plug contact member, when in position adjacent its cooperating socket contact member, against the said mating surface of the cooperating socket contact member.

22. An electrical connection socket according to claim 21, wherein each socket contact member has a resilient free end portion which is doubled back relative to a part thereof lying adjacent the supporting wall, and which provides the said contact making surface remote from the supporting wall.

23. An electrical connection socket according to claim 22, wherein each said supporting wall comprises an end wall of a socket contact member locating slot formed in the base member, and wherein each socket member is secured in its locating slot by wings formed on the sides of the contact member which project sideways into transverse recesses formed in the respective side walls of the slot.

24. An electrical assembly comprising an electrical connection socket according to claim 23 having its socket contact member in electrical contact with plug contact members of an electrical device.

25. An electrical assembly comprising an electrical connection socket according to claim 20 having its socket contact members in electrical contact with plug contact members of an electrical device.

* * * * *